(12) United States Patent
Burbidge et al.

(10) Patent No.: US 8,987,898 B2
(45) Date of Patent: Mar. 24, 2015

(54) SEMICONDUCTOR WAFER WITH REDUCED THICKNESS VARIATION AND METHOD FOR FABRICATING SAME

(75) Inventors: Rupert Burbidge, Oxted (GB); David Paul Jones, South Glamorgan (GB); Amarjit Dhadda, Cardiff (GB); Robert Montgomery, Cardiff (GB)

(73) Assignee: International Rectifier Corporation, El Segundo, CA (US)

(*) Notice: Subject to any disclaimer, the term of this patent is extended or adjusted under 35 U.S.C. 154(b) by 0 days.

(21) Appl. No.: 13/154,360

(22) Filed: Jun. 6, 2011

(65) Prior Publication Data

US 2012/0306072 A1 Dec. 6, 2012

(51) Int. Cl.
    H01L 23/488 (2006.01)
    H01L 21/304 (2006.01)
    H01L 21/683 (2006.01)

(52) U.S. Cl.
    CPC .......... *H01L 21/304* (2013.01); *H01L 21/6836* (2013.01); *H01L 2221/68327* (2013.01); *H01L 2221/6834* (2013.01); *H01L 2924/0002* (2013.01)
    USPC ............ 257/737; 257/E23.023; 257/E21.508; 438/613

(58) Field of Classification Search
    CPC .................. H01L 2924/0002; H01L 2924/00; H01L 21/304; H01L 21/6836; H01L 2221/68327; H01L 2221/6834
    USPC ................. 438/459, 977, 113, 514, 798, 613; 257/E21.214, 737, E21.211, E21.334, 257/E21.345, E21.472, E21.508, E23.023; 11/459, 977, 113
    See application file for complete search history.

(56) References Cited

U.S. PATENT DOCUMENTS

| | | | | |
|---|---|---|---|---|
| 5,869,354 A | * | 2/1999 | Leedy | 438/110 |
| 6,085,968 A | * | 7/2000 | Swindlehurst et al. | 228/254 |
| 6,268,656 B1 | * | 7/2001 | Leibovitz et al. | 257/737 |
| 6,563,712 B2 | * | 5/2003 | Akram et al. | 361/719 |
| 6,566,745 B1 | * | 5/2003 | Beyne et al. | 257/680 |
| 6,630,742 B2 | * | 10/2003 | Sakuyama | 257/772 |
| 6,841,853 B2 | * | 1/2005 | Yamada | 257/666 |
| 7,776,746 B2 | * | 8/2010 | Feng et al. | 438/690 |
| 8,048,775 B2 | * | 11/2011 | Feng et al. | 438/459 |
| 8,084,335 B2 | * | 12/2011 | Seddon et al. | 438/464 |
| 8,211,261 B2 | * | 7/2012 | Maki et al. | 156/265 |
| 2002/0014673 A1 | * | 2/2002 | Leedy | 257/419 |

(Continued)

Primary Examiner — Stephen W Smoot
Assistant Examiner — Edward Chin
(74) Attorney, Agent, or Firm — Farjami & Farjami LLP

(57) ABSTRACT

According to one embodiment, a semiconductor wafer comprises a plurality of solder bumps for providing device contacts formed over a functional region of the semiconductor wafer, and one or more support rings surrounding the functional region. The one or more support rings and the plurality of solder bumps are formed so as to have substantially matching heights. The presence of the one or more support rings causes the semiconductor wafer to have a substantially uniform thickness in the functional region after a thinning process is performed on the semiconductor wafer. A method for fabricating the semiconductor wafer comprises forming the plurality of solder bumps over the functional region, and forming the one or more support rings surrounding the functional region before performing the thinning process on the semiconductor wafer.

20 Claims, 5 Drawing Sheets

(56) References Cited

U.S. PATENT DOCUMENTS

| | | |
|---|---|---|
| 2003/0094962 A1* | 5/2003 | Rincon et al. .................. 324/754 |
| 2004/0140217 A1* | 7/2004 | Herchen ....................... 204/622 |
| 2005/0260829 A1 | 11/2005 | Uematsu |
| 2006/0038172 A1* | 2/2006 | Akram ............................ 257/48 |
| 2006/0220173 A1* | 10/2006 | Gan et al. ...................... 257/528 |
| 2010/0190464 A1* | 7/2010 | Chen et al. .................... 455/334 |
| 2011/0157853 A1* | 6/2011 | Goh .............................. 361/783 |
| 2011/0272806 A1* | 11/2011 | Akram et al. ................. 257/738 |

* cited by examiner

SEMICONDUCTOR WAFER WITH REDUCED THICKNESS VARIATION AND METHOD FOR FABRICATING SAME

BACKGROUND OF THE INVENTION

1. Field of the Invention

The present invention is generally in the field of semiconductor fabrication. More specifically, the present invention is in the field of semiconductor wafer fabrication.

2. Background Art

On-resistance can be an important operating parameter for semiconductor devices. The on-resistance of a power metal-oxide-semiconductor field-effect transistor (MOSFET), for example, is typically recognized to include resistance contributions from the semiconductor wafer substrate, the epitaxial semiconductor channel, and contributions from packaging. One approach to improving on-resistance includes reducing the wafer substrate resistance contribution by reducing the thickness of the wafer. However, care must be taken when thinning the wafer substrate to avoid variation in substrate thickness across the wafer, because a substantially uniform wafer thickness facilitates a desirably uniform on-resistance distribution for the power MOSFET devices fabricated on the wafer.

The manufacturing process that typically defines wafer thickness is backgrind. A backgrind process utilizes abrasives on grinding wheels to remove semiconductor substrate material from the back surface of a wafer and thereby reduce its initial thickness to a desirable thickness for improving device on-resistance. The backgrind processes typically in use are designed to minimize substrate thickness variation for wafers having a smooth front surface. Normally, wafer front surfaces are laminated with a polymeric tape (known as backgrind tape) that both protects the front surface of the wafer from debris on the grinding chuck and also has the capability to absorb a limited amount of surface irregularity on the front surface of the wafer, so that those irregularities are not transferred to the back surface during backgrind.

However, in some fabrication processes it may be desirable to perform the backgrind operation on wafers after solder bumps have been formed on the front surface. The solder bumps are typically disposed on device pads across the wafer front surface. The application of backgrind tape under these conditions may absorb the topography produced by the solder bumps to some extent, but transfer of irregularities remaining on the front surface often still occurs due to the relatively large size of the solder bumps, resulting in undesirable variation in substrate thickness after backgrind.

Thus, there is a need to overcome the drawbacks and deficiencies in the art by enabling a semiconductor wafer with solder bumps formed thereon to undergo a backgrind or other thinning process without suffering substantial substrate thickness variation as a result.

SUMMARY OF THE INVENTION

The present invention is directed to a semiconductor wafer with reduced thickness variation and method for fabricating same, substantially as shown in and/or described in connection with at least one of the figures, and as set forth more completely in the claims.

DETAILED DESCRIPTION OF THE INVENTION

Figure 1A:
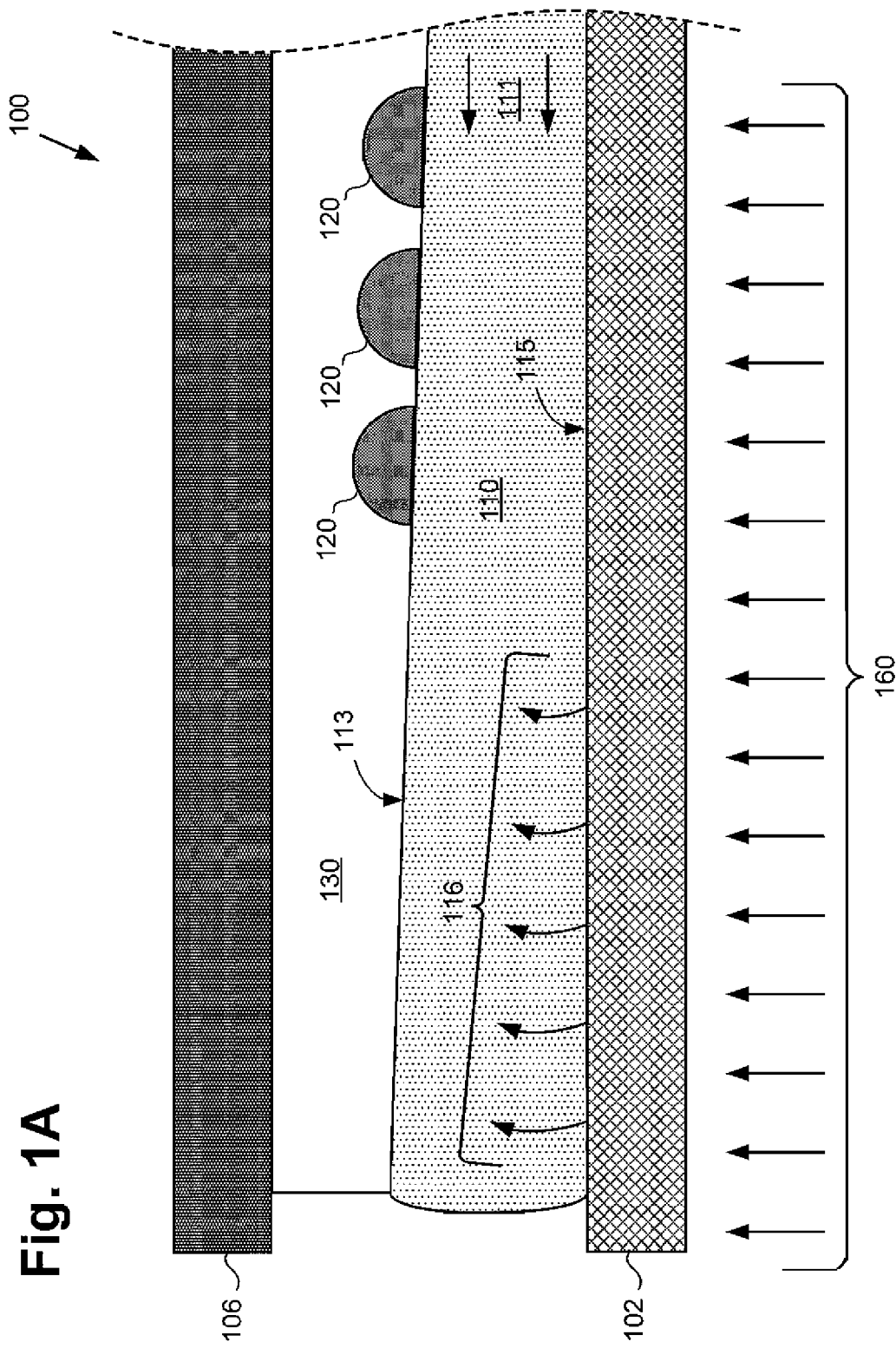
FIG. 1A shows a cross-sectional view of a peripheral region of a conventional semiconductor wafer during a thinning process.

The present invention is directed to a semiconductor wafer with reduced thickness variation and method for fabricating same. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely example embodiments of the invention. To maintain brevity, other embodiments of the invention, which use the principles of the present invention, are not specifically described in the present application and are not specifically illustrated by the present drawings. It should be borne in mind that, unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1A shows a cross-sectional view of a peripheral region of a conventional semiconductor wafer during a thinning process. Processing environment 100 shows grinding wheel 102, grinding chuck 106, peripheral region 111 of semiconductor wafer 110, and backgrind tape 130, as semiconductor wafer 110 undergoes a thinning process, which is represented in FIG. 1A as a backgrind process. Processing environment 100, shows semiconductor wafer 110 having a plurality of solder bumps 120 formed over front surface 113 and having back surface 115 in contact with grinding wheel 102, which is depicted as applying grinding force 160 against back surface 115 of semiconductor wafer 110.

As explained above, backgrind is typically the manufacturing process that defines wafer thickness and thereby may be utilized to reduce the resistance contribution due to substrate thickness to the on-resistance of devices fabricated on semiconductor wafer 110. As shown in FIG. 1A, front surface 113 of semiconductor wafer 110 has been to laminated with backgrind tape 130, e.g., normally a polymeric tape, provided to protect front surface 113 of semiconductor wafer 110 from debris on grinding chuck 106, as well as to absorb minor topological irregularities on front surface 113 so that those irregularities are not transferred to back surface 115 during backgrind.

However, when, as is represented in FIG. 1A, it is desirable to perform the backgrind operation on semiconductor wafer 110 after solder bumps 120 have been formed on front surface 113, backgrind tape 130 may be incapable of adequately compensating for the variations in surface topology resulting from the presence of solder bumps 120 at front surface 113. For example, backgrind tape 130 appears to cover to solder bumps 120 and to present a smooth surface to grinding chuck 106 on the backgrind machine (backgrind machine not shown in FIG. 1A). Grinding wheel 102 is then brought into contact with back surface 115 of semiconductor wafer 110 and preset grinding force 160 is applied. However, the application of grinding force 160 causes compliant backgrind tape 130 to compress near the perimeter of semiconductor wafer 110, where there are no solder bumps. Semiconductor wafer 110 bends into grinding chuck 106 in this region, as shown by flex lines of force 116, and the grinding rate is thereby reduced in much of peripheral region 111 compared with the other portions of semiconductor wafer 110 interior to peripheral region 111.

Figure 1B:
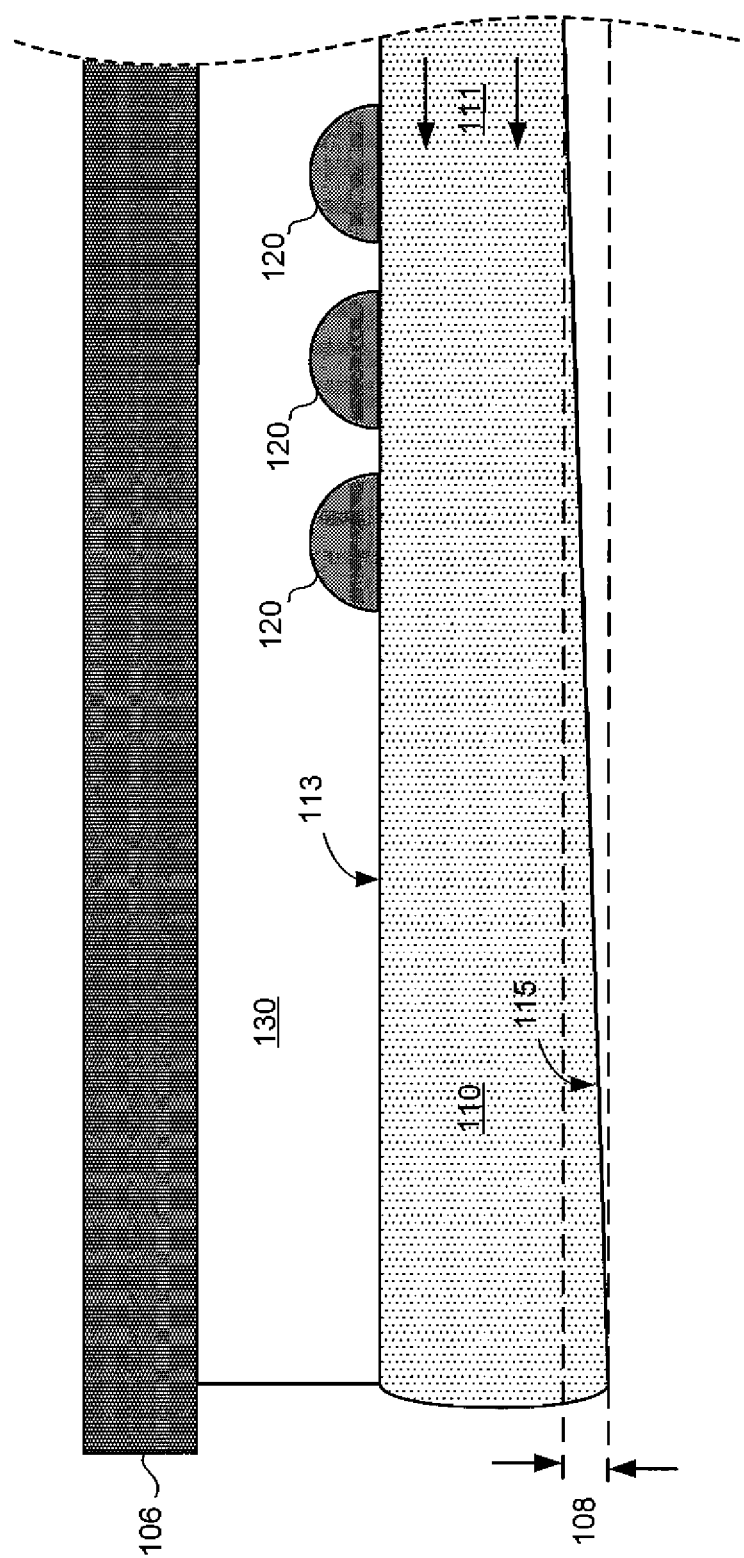
FIG. 1B shows a cross-sectional view of the semiconductor wafer peripheral region of FIG. 1A after the thinning process.

The result of the conditions depicted in FIG. 1A is shown by FIG. 1B. FIG. 1B provides a cross-sectional view of semiconductor wafer peripheral region 111 after the backgrind process of FIG. 1A is completed. As may be apparent from FIG. 1B, once grinding wheel 106 is withdrawn from back surface 115 of semiconductor wafer 110, flex lines of force 116 are eliminated and semiconductor wafer 110 can relax back to its original shape. However, due to the reduced grinding rate in peripheral region 111, the resultant wafer thickness is greater in this region, as indicated by thickness variation 108 at back surface 115 of semiconductor wafer 110. As shown in FIG. 1B, thickness variation 108 extends towards the interior region of semiconductor wafer 110, under solder bumps 120 and their corresponding devices, e.g., power MOSFETs fabricated in peripheral region 111 having solder bumps 120 as device contacts. Consequently, the semiconductor dies harvested from peripheral region 111 will have a greater on-resistance due to the additional substrate thickness corresponding to thickness variation 108, which is an undesirable outcome.

Figure 2A:
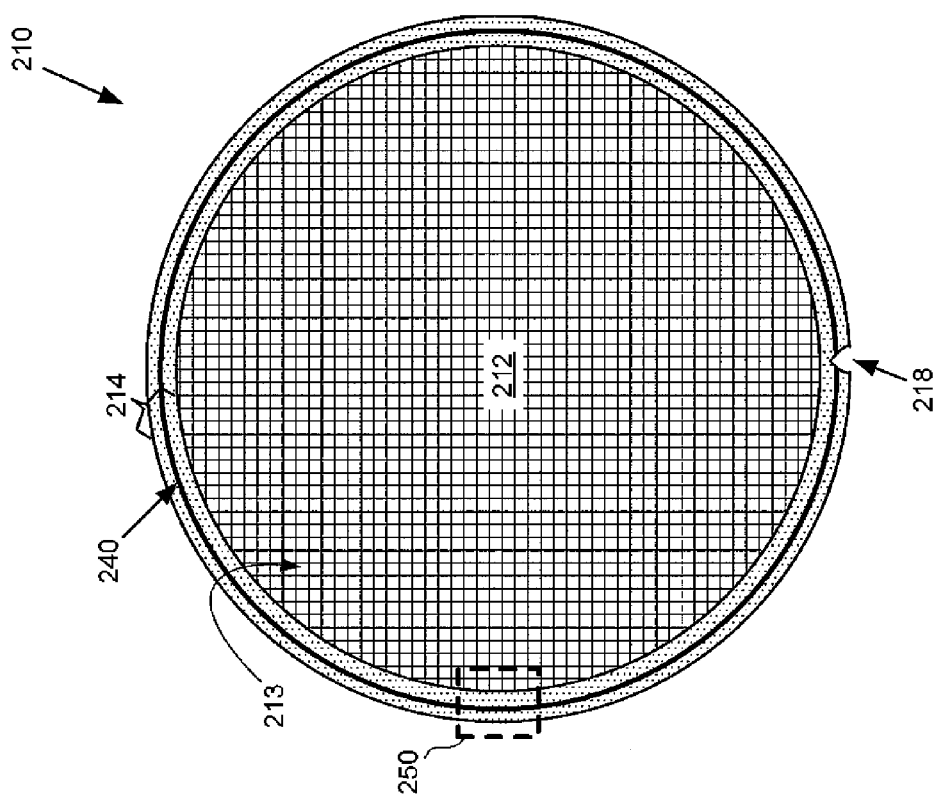
FIG. 2A shows a top view of a semiconductor wafer including a support ring, according to one embodiment of the present invention.

FIG. 2A show a top view of front surface 213 of semiconductor wafer 210 including support ring 240, according to one embodiment of the present invention, that is configured to overcome the drawbacks and deficiencies described by reference to FIGS. 1A and 1B. Semiconductor wafer 210 comprises functional region 212 wherein semiconductor devices have been fabricated according to any suitable methods, as known in the art. Semiconductor wafer 210 also includes perimeter zone 214 occupying area at the edge of semiconductor wafer 210. According to the embodiment of FIG. 2A, perimeter zone 214 is a device free region encircling functional region 212 wherein the devices of semiconductor wafer 210 are formed. The representation of semiconductor wafer 210 further shows region 250 in FIG. 2A, which is shown as enlarged detailed region 250 in FIG. 2B, and wafer notch 218 in FIG. 2A.

As shown in FIG. 2A, support ring 240 is formed in perimeter zone 214 and surrounds functional region 212. As further shown by enlarged detailed region 250 in FIG. 2B, in one embodiment support ring 240 may comprise a plurality of support rings. That is to say, support ring 240 comprises at least one ring, but in various implementations may comprise two, or more, support rings. As may be seen from semiconductor wafer 210, support ring 240 may take the form of a circle having its center substantially co-located with the geometric center of front surface 213. Moreover, where support ring 240 comprises more than one support ring, as shown in enlarged detailed region 250 in FIG. 2B, support ring 240 may comprise two or more substantially concentric support rings.

Figure 2B:
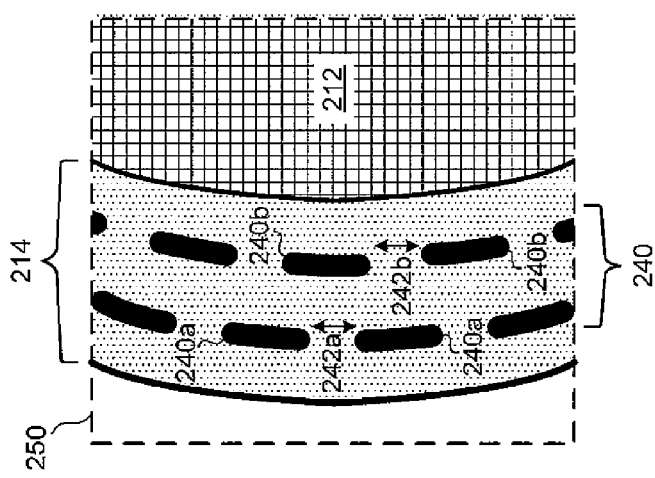
FIG. 2B shows an enlarged detailed view of a region of the semiconductor wafer shown in FIG. 2A.

It is noted that support ring 240 shown in FIG. 2A, e.g., shown surrounding functional region 212, appears to be continuous according to that depiction, except for the break introduced by wafer notch 218, while enlarged detailed region 250 in FIG. 2B shows a first support ring comprising support ring segments 240a separated by respective gaps 242a and a second support ring comprising support ring segments 240b separated by respective gaps 242b. However, in one embodiment, support ring 240 may comprise one or more support rings with no gaps, for example, a support ring or rings continuously surrounding functional region 212 (except possibly for the gap produced by wafer notch 218).

In other embodiments in which wafer notch 218 is omitted from semiconductor wafer 210, support ring 240 may comprise one or more substantially continuous rings surrounding functional region 212. Alternatively, as shown by enlarged detailed region 250 in FIG. 2B, in some embodiments, support ring 240 may include one or more ringed arrangements of gapped ring segments. Moreover, in those latter embodiments, adjacent support rings may be configured such that their respective gaps are not aligned. Referring to enlarged detailed region 250 of FIG. 2B, for example, it may be seen that gaps 242a and 242b are not aligned. In yet other embodiments of the present invention, support ring 240 may include a combination of substantially continuous and gapped support rings. It is noted that in at least one embodiment of the present invention, as indicated for example by the representations in FIG. 2A, it is intended for support ring(s) 240 to occupy less than or approximately equal to fifty percent (50%) of the area of device free perimeter zone 214.

Figure 3:
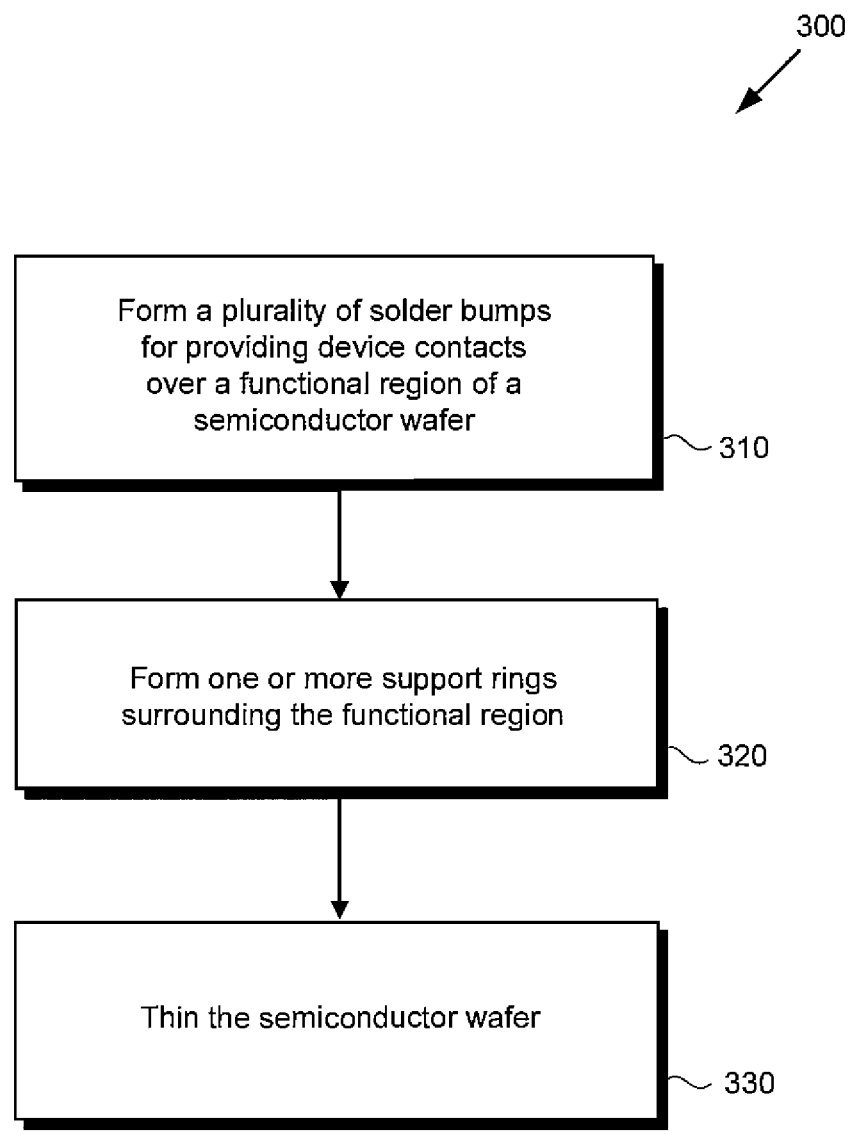
FIG. 3 is a flowchart presenting a method for fabricating a semiconductor wafer including a support ring, according to one embodiment of the present invention.
Figure 4:
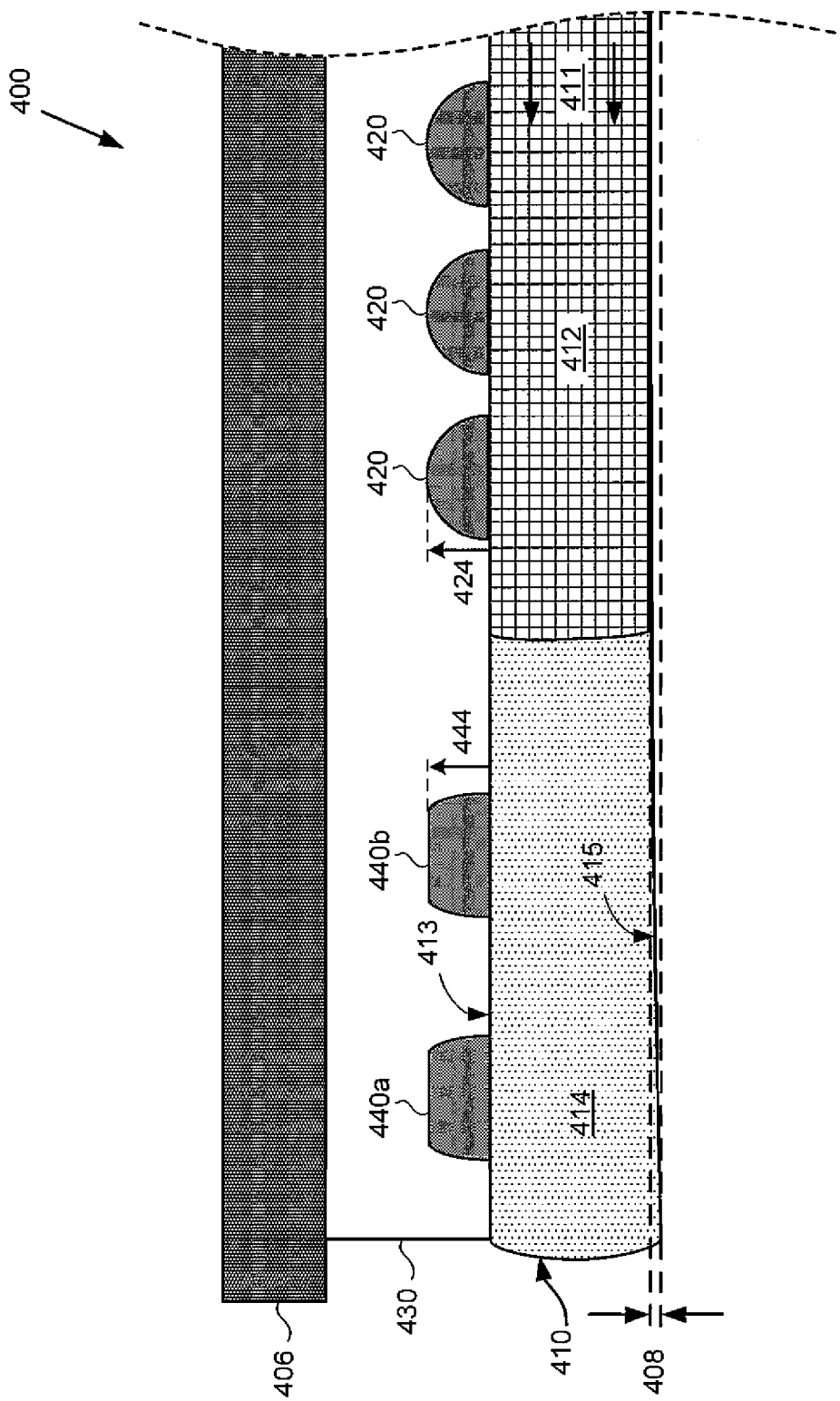
FIG. 4 shows a cross-sectional view of a peripheral region of a semiconductor wafer including a support ring, according to one embodiment of the present invention, after a thinning process has been performed.

The advantages resulting from the semiconductor wafer structure shown in FIGS. 2A and 2B will become more apparent by reference to FIGS. 3 and 4. FIG. 3 shows a flowchart presenting a method for fabricating a semiconductor wafer including a support ring, according to one embodiment of the present invention, while FIG. 4 shows a cross-sectional view of a semiconductor wafer including a support ring after completion of a thinning process, such as a backgrind process analogous to the process depicted by FIGS. 1A and 1B. Processing environment 400, in FIG. 4, shows peripheral region 411 of semiconductor wafer 410 in combination with grinding chuck 406 and backgrind tape 430. Semiconductor wafer 410 includes functional region 412 extending beyond the border of peripheral region 411, and device free perimeter zone 414. Semiconductor wafer 410 further includes solder bumps 420 formed over functional region 412 and support rings 440a and 440b (shown in cross-section) formed over device free perimeter zone 414. Also shown in FIG. 4 are back surface 415 of semiconductor wafer 410 and thickness variation 408 resulting from backgrind of semiconductor wafer 410.

Turning to FIG. 3, flowchart 300 sets forth a method, according to one embodiment of the present invention, for fabricating a semiconductor wafer including a solder ring and having a substantially uniform thickness across its functional region. Certain details and features have been left out of flowchart 300 that are apparent to a person of ordinary skill in the art. For example, a step may comprise one or more substeps or may involve specialized equipment or materials, as known in the art. While steps 310 through 330 indicated in flowchart 300 are sufficient to describe one embodiment of the present invention, other embodiments of the invention may utilize steps different from those shown in flowchart 300, or may comprise more, or fewer, steps.

Step 310 of flowchart 300 comprises forming a plurality of solder bumps for providing device contacts over a functional region of a semiconductor wafer. Referring to FIG. 4, step 310 may be seen to correspond to formation of solder bumps 420 over functional region 412. As may be further understood from the top view of semiconductor wafer 210, in FIG. 2A, solder bumps corresponding to solder bumps 420, in FIG. 4, may be formed over the functional region 212 in order to provide device contacts for the semiconductor device fabricated in functional region 212. Formation of solder bumps may be performed according to any suitable technique as known in the art.

Continuing with step 320, in FIG. 3, and continuing to refer to semiconductor wafer 210 in FIG. 2A, step 320 of flowchart 300 comprises forming one or more support rings 240 surrounding functional region 212. As explained in relation to FIGS. 2A and 2B, support ring 240 may comprise one or more support rings, and may include substantially continuous support rings, support rings including at least one gap, and/or support rings formed from multiple support ring segments separated by gaps. For example, as shown by enlarged detailed region 250 in FIG. 2B, support ring 240 may comprise two substantially concentric support rings that together occupy less than or approximately equal to fifty percent (50%) of the area of device free perimeter zone 214.

Step 320 may comprise forming support ring(s) 240 comprising solder, for example, and may proceed according to techniques analogous to those employed for formation of solder bumps in step 310. Moreover, as shown by FIG. 4, in the present embodiment, support rings 440a and 440b are characterized by a height that substantially matches the height of solder bumps 420. As shown in FIG. 4, support rings 440a and 440b may extend distance 444 above front surface 413 of semiconductor wafer 410, while solder bumps 420 extend a distance 424 above front surface 413. According to some embodiments of the present invention, distances 444 and 424 may be substantially equal. Alternatively, distance 444 may vary from distance 424, but fall within a specified range of distance 424, such as within plus-or-minus approximately twenty percent (20%) of distance 424.

Moving to step 330 in FIG. 3, and continuing to refer to processing environment 400 in FIG. 4, step 330 of flowchart 300 comprises thinning semiconductor wafer 410. Step 330 may be performed using a backgrind process, as described above by reference to FIG. 1A. Unlike the process described in FIG. 1A, however, backgrind of semiconductor wafer 410 including support rings 440a and 440b results in a substantially reduced thickness variation 408 when compared to more conventional thickness variation 108 (shown in FIG. 1B), and advantageously results in substantial elimination of thickness variation 408 under functional region 412. Consequently, the substrate thickness across functional region 412 is substantially uniform after thinning, thereby enabling fabrication of devices, such as power MOSFET devices, that concurrently display reduced on-resistance and a desirably uniform on-resistance distribution.

In addition to enabling consistent and reduced on-resistances for the devices fabricated on semiconductor wafer 410, the presence of support rings 440a and 440b in perimeter zone 414 may also enable more consistent adhesion of backgrind tape 430. As result, the presence of support rings 440a and 440b may make it less likely for backgrind tape 430 to delaminate around the periphery of semiconductor wafer 410. Because such delamination may permit ingress of water or grinding chemicals under backgrind tape 430 during the backgrind process, and/or permit ingress of etchants during subsequent stress relief etching processes, including support rings 440a and 440b on semiconductor wafer 410 provides advantageous additional protections to the devices fabricated on the semiconductor wafer.

Thus, by providing one or more support rings surrounding a functional region of a semiconductor wafer, embodiments of the present invention disclose a structure and related method configured to facilitate wafer substrate thinning and thereby improve semiconductor device performance. Moreover, by forming one or more support rings having heights substantially matching the heights of solder bumps providing device contacts over the functional region, embodiments of the present invention enable a significant reduction in, or substantial elimination of, substrate thickness variation across the functional region, thereby advantageously achieving uniform on-resistance distribution in devices fabricated on the semiconductor wafer.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A semiconductor wafer comprising:
a plurality of solder bumps for providing device contacts over a functional region of said semiconductor wafer;
at least two support rings surrounding said functional region;
said at least two support rings and said plurality of solder bumps being situated on one surface of said semiconductor wafer;
said at least two support rings formed in a device free perimeter zone of said semiconductor wafer and said plurality of solder bumps situated on said functional region of said semiconductor wafer substantially matching in height;
said at least two support rings causing said semiconductor wafer to have a substantially uniform thickness in said functional region after a thinning process is performed on said semiconductor wafer.

2. The semiconductor wafer of claim 1, wherein said at least two support rings are substantially continuous.

3. The semiconductor wafer of claim 1, wherein said at least two support rings comprise at least one gap.

4. The semiconductor wafer of claim 1, wherein said at least two support rings comprise support ring segments surrounding said functional region, said support ring segments being spaced apart by gaps.

5. The semiconductor wafer of claim 1, wherein said at least two support rings comprise several substantially concentric support rings.

6. The semiconductor wafer of claim 5, wherein said several substantially concentric support rings each comprise support ring segments spaced apart by gaps.

7. The semiconductor wafer of claim 1, wherein said at least two support rings comprise two substantially concentric support rings.

8. The semiconductor wafer of claim 1, wherein said at least two support rings extend a first distance above said one surface of said semiconductor wafer and said plurality of solder bumps extend a second distance above said one surface, and wherein said first distance is within plus-or-minus approximately twenty percent (20%) of said second distance.

9. The semiconductor wafer of claim 1, wherein said at least two support rings occupy less than or equal to approximately fifty percent (50%) of said device free perimeter zone.

10. The semiconductor wafer of claim 1, wherein said at least two support rings comprise a solder ring.

11. A method for fabricating a semiconductor wafer, said method comprising:
   forming a plurality of solder bumps on one surface of said semiconductor wafer, said plurality of solder bumps for providing device contacts over a functional region of said semiconductor wafer;
   forming at least two support rings on said one surface of said semiconductor wafer and surrounding said functional region, said at least two support rings formed in a device free perimeter zone of said semiconductor wafer and said plurality of solder bumps situated on said functional region of said semiconductor wafer substantially matching in height;
   wherein said at least two support rings cause said semiconductor wafer to have a substantially uniform thickness in said functional region after a thinning process is performed on said semiconductor wafer.

12. The method of claim 11, further comprising thinning said semiconductor substrate after forming said at least two support rings surrounding said functional region.

13. The method of claim 11, wherein forming said at least two support rings comprises forming two substantially continuous support rings.

14. The method of claim 11, wherein forming said at least two support rings comprises forming two support rings with each including at least one gap.

15. The method of claim 11, wherein forming said at least two support rings comprises forming support ring segments surrounding said functional region, said support ring segments spaced apart by gaps.

16. The method of claim 11, wherein forming said at least two support rings comprises forming several substantially concentric support rings.

17. The method of claim 16, wherein said several substantially concentric support rings comprise support ring segments spaced apart by gaps.

18. The method of claim 11, wherein forming said at least two support rings comprises forming two substantially concentric support rings.

19. The method of claim 11, wherein said at least two support rings extend a first distance above said one surface of said semiconductor wafer and said plurality of solder bumps extend a second distance above said one surface, and wherein said first distance is within plus-or-minus approximately twenty percent (20%) of said second distance.

20. The method of claim 11, wherein said at least two support rings occupy less than or equal to approximately fifty percent (50%) of said device free perimeter zone.

* * * * *